United States Patent [19]
Griffin et al.

[11] Patent Number: 5,367,434
[45] Date of Patent: Nov. 22, 1994

[54] ELECTRICAL MODULE ASSEMBLY

[75] Inventors: Curtis M. Griffin, Boca Raton; James V. Lauder, Ft. Lauderdale; Leng H. Ooi, Sunrise, all of Fla.

[73] Assignee: Motorola, Inc., Schaumburg, Ill.

[21] Appl. No.: 57,376

[22] Filed: May 6, 1993

[51] Int. Cl.$^5$ .............................................. H05K 7/20
[52] U.S. Cl. ................................. 361/719; 174/35 R; 174/252; 257/713; 361/799; 361/800; 361/820
[58] Field of Search ............... 455/300, 311, 347; 165/80.3, 185; 257/706, 707, 712, 713, 720; 174/35 R, 35 C, 51, 252, 260–263; 361/704, 707, 717–719, 736, 743, 744, 764, 796, 761, 799, 800, 803, 814, 816, 820

[56] References Cited

U.S. PATENT DOCUMENTS

| | | | |
|---|---|---|---|
| 3,304,468 | 2/1967 | Lawson | 361/743 |
| 4,001,711 | 1/1977 | Knutson | 330/66 |
| 4,339,628 | 7/1982 | Marcantonio | 361/744 |
| 4,514,784 | 4/1985 | Williams | 361/744 |
| 4,812,949 | 3/1989 | Fontam | 361/704 |
| 4,931,908 | 6/1990 | Boucard | 361/743 |
| 5,005,106 | 4/1991 | Kiku | 174/35 C |
| 5,019,940 | 5/1991 | Clemens | 361/719 |
| 5,025,347 | 6/1991 | Shindo | 361/719 |
| 5,064,388 | 11/1991 | Paladel | 174/35 C |
| 5,198,887 | 3/1993 | Brown | 361/717 |

OTHER PUBLICATIONS

Hermetic Hybrid Module, Martin, IBM Tech Discl Bull vol. 21 No. 10 Mar. 1979, pp. 4023, 4024.

*Primary Examiner*—Gerald P. Tolin
*Attorney, Agent, or Firm*—Daniel K. Nichols; Andrew S. Fuller

[57] ABSTRACT

An electrical module assembly (100) includes a mounting frame (130) having a passage (135) extending though the mounting frame (130). A heat sink (160) is positioned within the passage (135) of the mounting frame (130). A module substrate (120) is located on or near the heat sink (160) such that there is thermal conductivity between the module substrate (120) and the heat sink (160). A heat-generating semiconductor device (122), such as a power amplifier (122), which requires heat dissipation, is positioned on the module substrate (120) such that there is thermal conductivity between the heat-generating semiconductor device and the heat sink (160). Electrical connection to the module substrate (120) is provided through the mounting frame (130).

4 Claims, 2 Drawing Sheets

5,367,434

ELECTRICAL MODULE ASSEMBLY

TECHNICAL FIELD

This invention relates in general to electrical module assemblies, and in particular, to the incorporation of a heat sink into an electrical module assembly.

BACKGROUND

Applications utilizing electrical modules which generate an appreciable amount of heat, usually require that heat dissipation paths are designed in to prevent overheating of these modules. One popular solution is to locate a heat sink, such as a metal plate, at or near the site of the heat generating module, and providing a thermal path for heat to travel from this heat sink to other heat dissipating locations. For example, a relatively large power amplifier can be implemented on a substrate, and this substrate is mounted on a heat sink, and the heat sink is mounted on another substrate such as a printed circuit board. A heat dissipation path could be created by thermally connecting the heat sink to the frame of chassis of the host device. Leads would provide the electrical connection between the substrate containing the power amplifier and the printed circuit board. Similar configurations are quite common in the art.

Despite some of the obvious manufacturing advantages of using leadless surface mountable modules, the use of leads has persisted to provide electrical connection between the module containing the heat generating electrical components and the general circuitry for the application. This results from the traditional design of placing the heat, sink, which can be rather bulky, directly under the module, so that the electrical connections must be routed around the heat sink. Thus, leads are often used to accomplish this routing.

However, there are several problems which are inherent in the use of leaded electrical modules in the assembly of electronic circuitry. One such problem is that of lack of planarity, i.e., where the ends of the leads are not all on the same level or plane. Lack of planarity may prevent proper electrical connection between the component and the supporting substrate, thus affecting the ease of manufacture and the reliability of the assembly. Automatic placement of leaded components can also be difficult, depending on the size and orientation of the module, and hand placement may be necessary. Some applications, such as those involving wireless communications, require shielding of certain electrical modules to minimize electrical interference and spurious radiation emissions from the module. With leaded modules, the shields need openings to accommodate the leads, or alternatively, the shields need to be shaped to encompass the leads. Assuming the application is implemented on a printed circuit board (PCB), the PCB layout must accommodate these shields and this can reduce the space available for the other circuit components.

The problems described thus far are particularly prevalent with the use of power amplifiers in the wireless communications industry. The packaging of high output power amplifiers or other high energy modules with large heat dissipation requirements have traditionally relied on leads to electrically connect the module to the printed circuit board. However, the demand for increase product quality and reduced manufacturing costs requires new solutions to the packaging design for these modules. As such, it is desirable to eliminate the leads for these electrical modules while retaining the heat dissipation characteristics of existing packages.

SUMMARY OF THE INVENTION

The invention is an electrical module assembly which incorporates a heat sink. The electrical module assembly includes a mounting frame which has a passage extending there through. A thermal conductive member is positioned within the passage of the mounting fame and a module substrate is thermally connected to the thermal conductive member. A heat-generating semiconductor device, which requires heat dissipation, is mounted onto the module substrate such that the heat-generating semiconductor device is thermally connected to the thermal conductive member. Electrical connection means, extending through the mounting frame, provides electrical connection to the module substrate.

DETAILED DESCRIPTION OF THE PREFERRED EMBODIMENT

Figure 1:
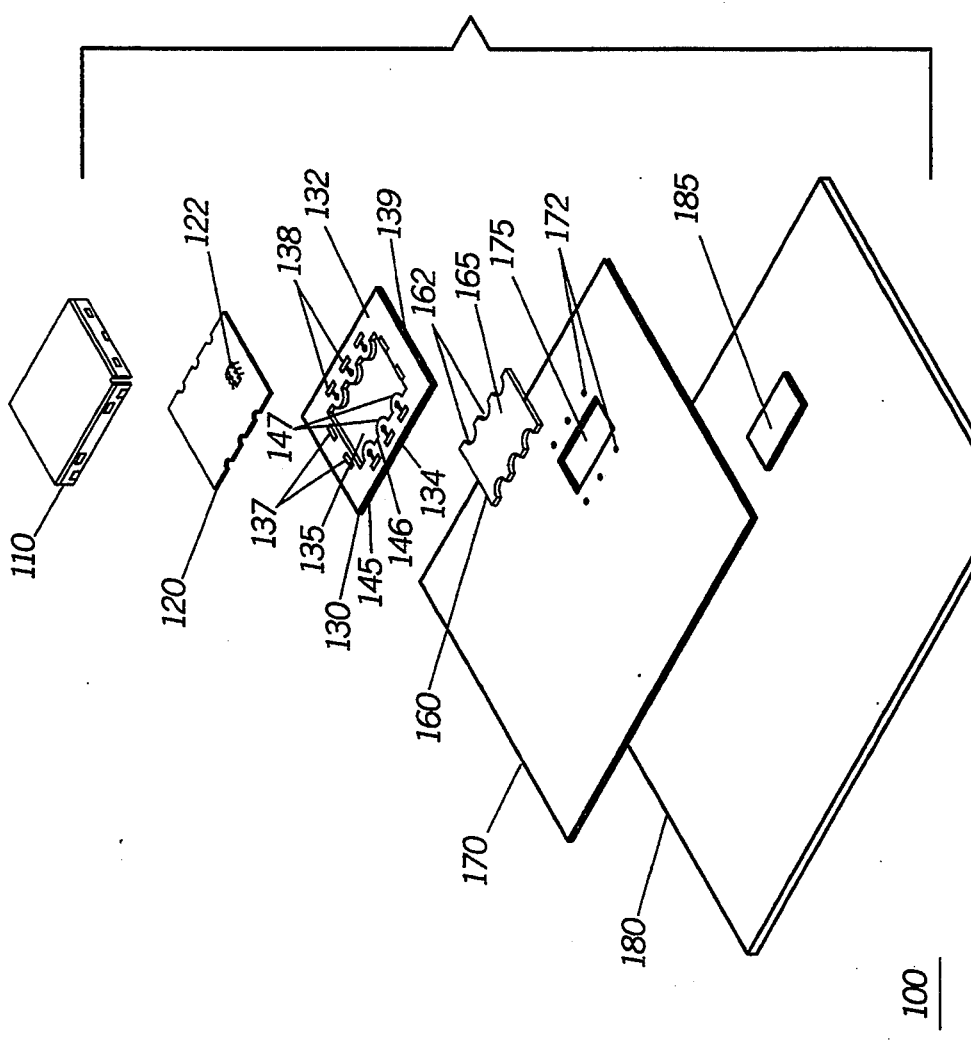
FIG. 1 is a an exploded perspective view of an electrical module assembly in accordance with the present invention.
Figure 2:
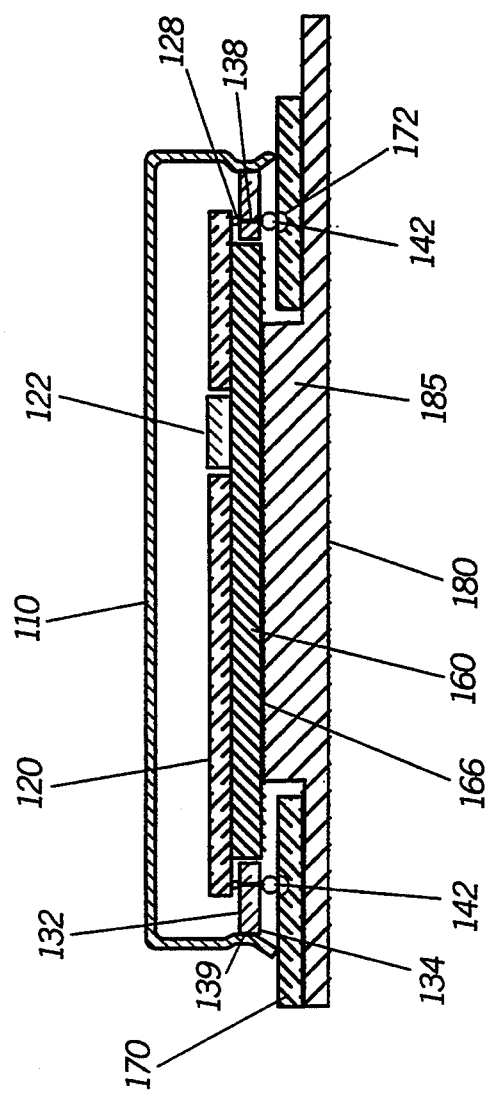
FIG. 2 is a cross-sectional view of the electrical module of FIG. 1.

Referring to FIG. 1, an exploded view of an electrical module assembly 100 is shown in accordance with the present invention. A module substrate 120 with a heat-generating semiconductor device, such as a power amplifier 122, is mounted onto a thermal conductive member ("heat sink") 160, such that there is thermal conductivity between the heat-generating semiconductor device 122 and the heat sink 160. Thus, the heat-generating semiconductor device 122 is thermally connected to the heat sink 160. The heat sink 160 is positioned within a cavity 135 in a mounting frame 130 and extends beyond the base 134 of the mounting frame 130. The module substrate 120 is mounted to the mounting frame 130 as by soldering. The module substrate 120 is also electrically connected to a support substrate, such as a printed circuit board 170, via electrically conductive paths 137,138, or other electrical connection means, extending through the mounting frame 130. A shield 110 is mounted over the module substrate 120 and onto the mounting frame 130. Referring to FIG. 2, the mounting frame 130 is soldered onto the printed circuit board 170 using solder balls 142. The use of solder balls 142 aids in the accommodation of minor variations of the various elements of the assembly. Heat from the power amplifier 122 is dissipated through a frame or chassis 180, which in the preferred embodiment may be the frame of a radio. The chassis 180 is thermally connected to the heat sink 160 via a cusp 185 located on the chassis 180 through an opening 175 in the printed circuit board 170.

Referring again to FIG. 1, the module substrate 121) houses the electrical components and electrical circuitry comprising the power amplifier 122. In the preferred embodiment, the module substrate 120 is soldered to the heat sink 160. Preferably, the module substrate 120 is made from a ceramic material, however, any suitable material may be used. The power amplifier 122 generates heat which must be dissipated to prevent damage to the power amplifier 122 or other surrounding components. Of course, the invention is also applicable where rather than the power amplifier 122, any heat-generating semiconductor device is mounted to the module substrate 120. As previously mentioned, the heat sink 160 is in thermal contact with the power amplifier on the module substrate 120. The power amplifier 122 may be placed through the module substrate 120 directly on the heat sink 160, or if the thermal characteristics of the module substrate 120 are satisfactory, it may be sufficient to mount the power amplifier 122 to the module substrate 120 and the module substrate 120 to the heat sink 160. The important requirement is to have sufficient thermal conductivity between the power amplifier 122 and the heat sink 160.

The heat sink 160 is a thermal conductive member formed from a material, such as aluminum, having good thermal conductivity.. The heat sink 160 is planar with a rectangular shape, having a flat; upper surface 165 and a flat lower surface 166, and the heat sink 160 is designed to fit within the cavity 135 of the mounting frame 130. As such, the heat sink 160 has curved recesses 162 to accommodate matching protrusions 147 within the cavity 135 of the mounting frame 130. The heat sink 160 also has sufficient height to allow simultaneous thermal connection between the module substrate 120 and the structure providing the heat dissipation path, which in this case is the radio frame 180. The design features relating to the particular shape of the heat sink 160 mentioned thus far are not critical to the operation of the invention. It is only important that the heat sink 160 provides a thermal path from the heat-generating semiconductor device 122 on the module substrate 120 to the host structure 180, or other heat dissipation paths.

The mounting frame 130 is an essentially planar rectangular ring with an inner border 146 and an outer border 146. The inner border 146 defines the perimeter of the cavity 135. The cavity 135 exists to provide a passage within the mounting frame 130 such that the heat sink 160 can be positioned within the mounting frame 130. Other configurations are possible. For example, the mounting frame 130 could be C-shaped thus forming a passage, or the mounting frame 130 could comprise two separate pieces with a passage defined between each piece. Referring to FIG. 2, the mounting frame 130 has a first opposing surface 132 and a second opposing surface 134. Within the mounting frame 130 are electrical conductors 138 and ground connectors 137, which permit electrical connection from the first opposing surface 132 to the second opposing surface 134, or vice versa. As depicted, electrical conductors 138 extend through the mounting frame 130 and form part of the electrical connection means which provides electrical connection to the module substrate 120. However, instead of electrical conductors, openings can exist within the mounting frame 130 thus creating conduits through which electrical connectors are routed. Referring back to FIG. 1, the electrical conductors 138 are housed in curved protrusions 147 located on the inner border 146 of the mounting frame 130. In this configuration, the heat sink 160 can provide some electrical shielding between the electrical conductors 138. The mounting frame 130 also has ground connectors 139 peripherally located on the outer border 145 to provide electrical ground connections for the shield 110. Referring to FIG. 2, solder pads 128 secure the module substrate to the mounting frame 130 and also provide electrical connection between the module substrate 120 and the mounting frame 130.

The shield 110 is included to help reduce or prevent electrical interference with other components of the host device, which in this case is a radio. The shield 110 mounts over the module substrate 120 and onto the mounting frame 130, electrically engaging the ground connectors 139 on the mounting frame 130. The shield provides substantial enclosure for the module substrate. Alternatively, the shield may mount over the module substrate and over the mounting frame, although electrical grounding may have to be accomplished in a different manner.

Referring to FIG. 1, the entire assembly as described thus far mounts onto the printed circuit board 170 and over the opening 175 in the printed circuit board. The printed circuit board 170 is just one of many support substrates which could be used. For example, a flexible circuit may be used in other applications. Referring to FIG. 2, in the preferred embodiment, the mounting frame 130 is secured to the printed circuit board 170 using solder balls 142. Receptors or indentations 172 are located on the printed circuit board 170 to aid in positioning the mounting frame 130. The solder balls 142 also provide electrical connection between the mounting frame 130 and the printed circuit board 170. When the solder is heated, the varying tolerances of the components of the electrical module assembly 100 are accommodated such that a proper electrical connection between the module substrate 120 and the printed circuit board 170 is maintained. The radio frame 180 thermally engages the heat sink 160 through the opening 175 in the printed circuit board 170 creating a heat dissipation path for heat generated by the power amplifier 122.

Thus, the present invention addresses many problems of the prior art. The electrical module assembly 100 is a leadless, surface mountable package which facilitates automated assembly. Electrical interference is minimized when the power amplifier 122, or any other similar module, is fully enclosed by the shield 110. Such enclosure is space efficient because the shield 110 mounts directly onto the mounting frame 130, and the shield 110 does not have to be perforated or shaped to accommodate leads. The heat sink 160 is integrated into the assembly thus making the assembly easy to handle.

What is claimed is:

1. A power amplifier module assembly, comprising:
   a mounting frame having a contoured cavity extending there through, said mounting frame is essentially planar, having first and second opposing sides, said mounting frame having electrical conductors integrally formed therein for electrically connecting portions of the first surface to portions of the second surface, said mounting frame having ground connectors peripherally located thereon;
   a thermal conductive member formed to fit within the cavity and being positioned within said cavity of said mounting frame;
   a module substrate having electrical components and electrical circuitry constituting a power amplifier, said module substrate mounted onto said thermal conductive member, said module substrate mounted to said first surface of said mounting frame, said module substrate electrically connected to said electrical conductors on said mounting frame;
   a heat-generating semiconductor device mounted onto said module substrate such that said heat-generating semiconductor device is thermally connected to said thermal conductive member; and a shield mounted over said module substrate onto said mounting frame, said shield electrically connected to said ground connectors on said mounting frame; wherein the mounting frame provides leadless external electrical interconnections to the module substrate.

2. A power amplifier module assembly as defined in claim 1, wherein said mounting frame has an inner border defining said contoured cavity with protrusions on said inner border for housing said electrical conductors, and wherein said thermal conductive member has recesses to the protrusions on the inner border.

3. An power amplifier module assembly as defined in claim 1, further comprising:

a support substrate, said support substrate electrically connected to said module substrate via said electrical conductors of said mounting frame; and solder balls attached to said second opposing surface of said mounting frame for mounting said mounting frame to said support substrate.

4. A radio having an electrical module assembly, comprising:

a printed circuit board having an opening therein;

a mounting frame leadlessly mounted on the printed circuit board about said opening, the mounting frame having a passage extending there through, said mounting frame is essentially planar, having first and second opposing sides, said mounting frame having electrical conductors integrally formed therein, said mounting frame having ground connectors peripherally located thereon;

a thermal conductive member positioned within said passage of said mounting frame;

a radio chassis having a portion thermally engaging the thermal conductive member through the opening in the printed circuit board;

a module substrate mounted onto said thermal conductive member, said module substrate mounted to said mounting frame, said module substrate electrically connected to said electrical conductors on said mounting frame;

a power amplifier mounted onto said module substrate such that said power amplifier is thermally connected to said thermal conductive member; and a shield mounted over said module substrate onto said mounting frame, said shield electrically connected to said ground connectors on said mounting frame.

* * * * *